(12) United States Patent
Hsu et al.

(10) Patent No.: US 10,949,100 B2
(45) Date of Patent: *Mar. 16, 2021

(54) CONFIGURABLE MEMORY STORAGE SYSTEM

(71) Applicant: Taiwan Semiconductor Manufacturing Co. Ltd., Hsinchu (TW)

(72) Inventors: Yu-Hao Hsu, Tainan (TW); Cheng Hung Lee, Hsinchu (TW); Chen-Lin Yang, Hsinchu County (TW); Chiting Cheng, Taichung (TW); Fu-An Wu, Hsinchu (TW); Hung-Jen Liao, Hsinchu (TW); Jung-Ping Yang, Hsinchu County (TW); Jonathan Tsung-Yung Chang, Hsinchu (TW); Wei Min Chan, Taipei County (TW); Yen-Huei Chen, Hsinchu County (TW); Yangsyu Lin, New Taipei (TW); Chien-Chen Lin, Kaohsiung (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 16/685,722

(22) Filed: Nov. 15, 2019

(65) Prior Publication Data

US 2020/0081636 A1    Mar. 12, 2020

Related U.S. Application Data

(63) Continuation of application No. 15/938,502, filed on Mar. 28, 2018, now Pat. No. 10,503,421.

(60) Provisional application No. 62/527,329, filed on Jun. 30, 2017.

(51) Int. Cl.
*G11C 5/14* (2006.01)
*G06F 3/06* (2006.01)
(Continued)

(52) U.S. Cl.
CPC .......... *G06F 3/0625* (2013.01); *G06F 3/0679* (2013.01); *G11C 5/147* (2013.01);
(Continued)

(58) Field of Classification Search
CPC ..... G06F 3/0625; G06F 3/0679; G11C 5/147; G11C 11/4074; G11C 16/12; G11C 16/30; H01B 10/03
(Continued)

(56) References Cited

U.S. PATENT DOCUMENTS

| 8,174,867 | B2 | 5/2012 | Wu |
| 9,570,170 | B2 | 2/2017 | Yoon et al. |

(Continued)

FOREIGN PATENT DOCUMENTS

| CN | 101826365 A | 9/2010 |
| CN | 105632552 A | 6/2016 |

(Continued)

*Primary Examiner* — Huan Hoang
(74) *Attorney, Agent, or Firm* — Sterne, Kessler, Goldstein & Fox P.L.L.C.

(57) ABSTRACT

Various embodiments for configurable memory storage systems are disclosed. The configurable memory storages selectively choose an operational voltage signal from among multiple operational voltage signals to dynamically control various operational parameters. For example, the configurable memory storages selectively choose a maximum operational voltage signal from among the multiple operational voltage signals to maximize read/write speed. As another example, the configurable memory storages selectively choose a minimum operational voltage signal from among the multiple operational voltage signals to minimize power consumption.

20 Claims, 11 Drawing Sheets

(51) Int. Cl.
*G11C 11/4074* (2006.01)
*G11C 16/30* (2006.01)
*G11C 16/12* (2006.01)
*H04B 10/03* (2013.01)
*H04B 10/27* (2013.01)
*H04J 14/02* (2006.01)

(52) U.S. Cl.
CPC .......... *G11C 11/4074* (2013.01); *G11C 16/12* (2013.01); *G11C 16/30* (2013.01); *H04B 10/03* (2013.01); *H04B 10/27* (2013.01); *H04J 14/0228* (2013.01); *H04J 14/0268* (2013.01)

(58) Field of Classification Search
USPC ..................................................... 365/189.09
See application file for complete search history.

(56) References Cited

U.S. PATENT DOCUMENTS

| | | | |
|---|---|---|---|
| 9,793,916 | B2 | 10/2017 | Kim |
| 10,503,421 | B2 * | 12/2019 | Hsu ........................ G06F 3/0679 |
| 2004/0004876 | A1 | 1/2004 | Choi et al. |
| 2004/0174763 | A1 | 9/2004 | Schnepper |
| 2016/0148683 | A1 | 5/2016 | Yoon et al. |
| 2019/0004718 | A1 | 1/2019 | Hsu et al. |

FOREIGN PATENT DOCUMENTS

| | | |
|---|---|---|
| CN | 107222197 A | 9/2017 |
| EP | 1143454 A1 | 10/2001 |
| KR | 100811273 B1 | 3/2008 |

\* cited by examiner

CONFIGURABLE MEMORY STORAGE SYSTEM

CROSS-REFERENCE TO RELATED APPLICATIONS

The present application is a continuation of U.S. patent application Ser. No. 15/938,502, filed Mar. 28, 2018, now U.S. Pat. No. 10,503,421, which claims the benefit of U.S. Provisional Patent Appl. No. 62/527,329, filed Jun. 30, 2017, each of which is incorporated herein by reference in its entirety.

BACKGROUND

A memory device is an electronic device for reading and/or writing electronic data. The memory device can be implemented as volatile memory, such as random-access memory (RAM), which requires power to maintain its stored information or non-volatile memory, such as read-only memory (ROM), which can maintain its stored information even when not powered. The RAM can be implemented in a dynamic random-access memory (DRAM), a static random-access memory (SRAM), and/or a non-volatile random-access memory (NVRAM), often referred to as a flash memory, configuration. The electronic data can be read from and/or written into an array of memory cells which can be accessible through various control lines. The two basic operations performed by the memory device are "read", in which the electronic data stored in the array of memory cells is read out, and "write" in which the electronic data is stored in the array of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
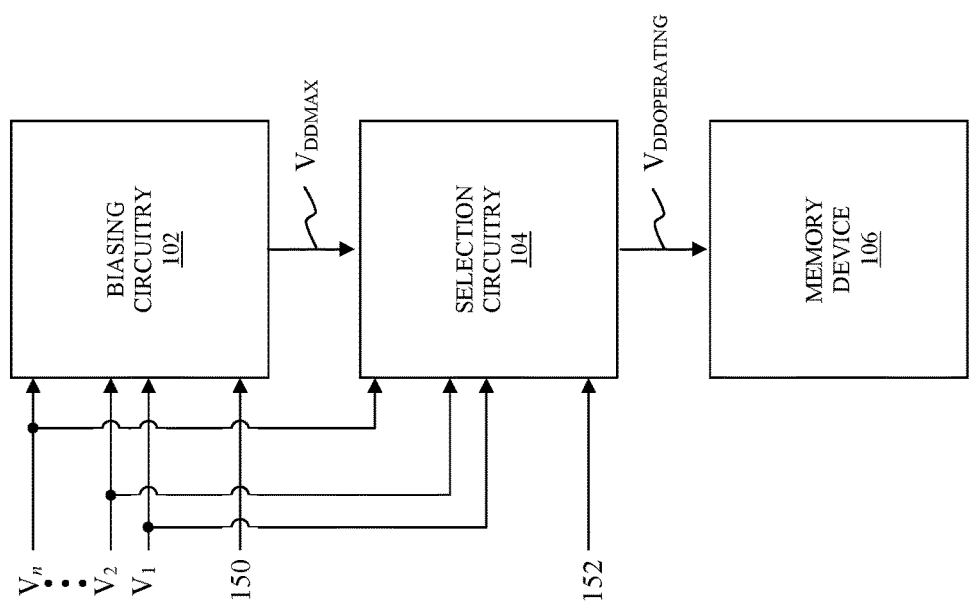
FIG. 1 illustrates a block diagram of an exemplary memory storage system according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations described.

Overview

Various embodiments for configurable memory storage systems are disclosed.

The configurable memory storages selectively choose an operational voltage signal from among multiple operational voltage signals to dynamically control various operational parameters. For example, the configurable memory storages selectively choose a maximum operational voltage signal from among the multiple operational voltage signals to maximize read/write speed. As another example, the configurable memory storages selectively choose a minimum operational voltage signal from among the multiple operational voltage signals to minimize power consumption.

Exemplary Memory Storage System

FIG. 1 illustrates a block diagram of an exemplary memory storage system according to an exemplary embodiment of the present disclosure. In the exemplary embodiment illustrated in FIG. 1, a memory storage system 100 selectively chooses between multiple operational voltage signals to configure operation of the memory storage system 100. In an exemplary embodiment, the memory storage system 100 can selectively choose various operational voltage signals from among the multiple operational voltage signals to dynamically control operation of the memory storage system 100. Herein, the terms "operational voltage signal," "operational voltage signals," "operating voltage signal," "operating voltage signals", and the like refer to supply voltage(s) that are required for the memory storage systems described herein to operate as planned, designed, manufactured, and/or constructed. For example, the memory storage system 100 can select a first operational voltage signal from among the multiple operational voltage signals to configure the memory storage system 100 to dynamically control, for example, minimize, one or more operational parameters, such as power consumption and/or read/write speed, from among multiple operational parameters of the memory storage system 100. As another example, the memory storage system 100 can select a second operational voltage signal from among the multiple operational voltage signals to configure the memory storage system 100 to dynamically control, for example, maximize, the one or more operational parameters of the memory storage system 100. In the exemplary embodiment illustrated in FIG. 1, the memory storage system 100 includes biasing circuitry 102, selection circuitry 104, and a memory device 106.

The biasing circuitry 102 selectively provides a maximum operating voltage signal $V_{DDMAX}$ from among the operational voltage signals $V_1$ through $V_n$ to the selection circuitry 104. In an exemplary embodiment, the biasing circuitry 102 includes multiple switches to selectively provide the maximum operating voltage signal $V_{DDMAX}$. In the exemplary embodiment illustrated in FIG. 1, the biasing circuitry 102 selectively provides the maximum operating voltage signal $V_{DDMAX}$ in accordance with a biasing control signal 150. In another exemplary embodiment, the biasing control signal 150 includes one or more control bits to indicate the maximum operating voltage signal from among the operational voltage signals $V_1$ through $V_n$. In this other exemplary embodiment, various combinations of the one or more control bits correspond to various operational voltage signals from among the operational voltage signals $V_1$ through $V_n$. As such, the biasing control signal 150 can configure the biasing circuitry 102 to selectively provide the maximum operating voltage signal $V_{DDMAX}$ by setting the one or more control bits of the biasing control signal 150 to be a combination of control bits corresponding to the maximum operating voltage signal.

The selection circuitry 104 selectively provides an operating voltage $V_{DDOPERATING}$ from among the operational voltage signals $V_1$ through $V_n$ to the memory device 106. In the exemplary embodiment illustrated in FIG. 1, the selection circuitry 104 utilizes the maximum operating voltage signal $V_{DDMAX}$ to shift the selection control signal 152 to a domain corresponding to the maximum operating voltage signal $V_{DDMAX}$. In an exemplary embodiment, the selection circuitry 104 includes multiple switches to selectively provide the operating voltage $V_{DDOPERATING}$. In this exemplary embodiment, the selection circuitry 104 provides one or more switching control signals to activate, namely, close, one or more of the multiple switches when at a first logical level, such as a logical zero to provide an example, and/or deactivate, namely, open, remaining switches from among the multiple switches when at a second logical level, such as a logical one to provide an example. Additionally, in this exemplary embodiment, the selection circuitry 104 shifts the second logical level of the one or more switching control signals to correspond to the maximum operating voltage signal $V_{DDMAX}$ to ensure the multiple switches properly open and/close in response to the selection control signal 152. For example, the selection control signal 152 can be at the first logical level to activate, namely, close, one or more of the multiple switches, or at the second logical level corresponding to the maximum operating voltage signal $V_{DDMAX}$ to deactivate, namely, open, the remaining switches from among the multiple switches.

In the exemplary embodiment illustrated in FIG. 1, the selection control signal 152 as illustrated in FIG. 1 includes one or more control bits. In some situations, various combinations of the one or more control bits can be assigned to various operational voltage signals from among the operational voltage signals $V_1$ through $V_n$. In an exemplary embodiment, the operational voltage signals $V_1$ through $V_n$ include the operational voltage signal $V_1$ and the operational voltage signal $V_2$. In this exemplary embodiment, a logical zero can be assigned to the first operational voltage signal $V_1$ and a logical one can be assigned to the second operational voltage signal $V_2$. The one or more control bits can be set to various combinations to select corresponding operational voltage signals from among the operational voltage signals $V_1$ through $V_n$ to dynamically control the multiple operational parameters of the memory device 106. From the exemplary embodiment above, the selection control signal 152 can be set to the logical zero to cause the selection circuitry 104 to select the first operational voltage signal $V_1$ as the operating voltage $V_{DDOPERATING}$ or to the logical one to cause the selection circuitry 104 to select the second operational voltage signal $V_2$ as the operating voltage $V_{DDOPERATING}$. As another example, the one or more control bits can be set to a first combination of bits to select a minimum operational voltage signal from among the operational voltage signals $V_1$ through $V_n$ to dynamically control, for example, minimize, the power consumption of the memory device 106. As a further example, the one or more control bits can be set to a second combination of bits to select a maximum operational voltage signal from among the operational voltage signals $V_1$ through $V_n$ to dynamically control, for example, maximize, the read/write speed of the memory device 106. In a further exemplary embodiment, the selection control signal 152 can be switched during operation of the memory storage system 100 to dynamically configure the memory device 106 on the fly to control the one or more operational parameters. For example, the selection control signal 152 can be set to the second combination of bits to maximize the read/write speed of the memory device 106 and be dynamically re-configured on the fly to a different combination of bits to reduce maximize the read/write speed of the memory device 106.

The memory device 106 receives the operating voltage $V_{DDOPERATING}$ selectively chosen from among operational voltage signals $V_1$ through $V_n$. In the exemplary embodiment illustrated in FIG. 1, the memory device 106 includes at least a memory array, column selection circuitry, and/or a write driver to provide some examples. In this exemplary embodiment, the memory device 106 provides the operating voltage $V_{DDOPERATING}$ to at least the memory array. In an exemplary embodiment, the read/write speed of the memory device 106 can be maximized by selectively choosing the maximum operating voltage signal $V_{DDMAX}$ from among the operational voltage signals $V_1$ through $V_n$ as the operating voltage $V_{DDOPERATING}$. In this example, the maximum operating voltage signal $V_{DDMAX}$ can cause various transistors of the memory device 106 to turn off and/or on at faster rate when compared to other operational voltage signals from among the operational voltage signals $V_1$ through $V_n$. As another example, the power consumption of the memory device 106 can be minimized by selectively choosing a minimum operating voltage signal $V_{DDMIN}$ from among the operational voltage signals $V_1$ through $V_n$ as the operating voltage $V_{DDOPERATING}$. In this other example, the minimum operating voltage signal $V_{DDMIN}$ causes less unwanted leakage among the various transistors of the memory device 106 when compared to other operational voltage signals from among the operational voltage signals $V_1$ through $V_n$.

First Exemplary Biasing Circuitry

Figure 2:
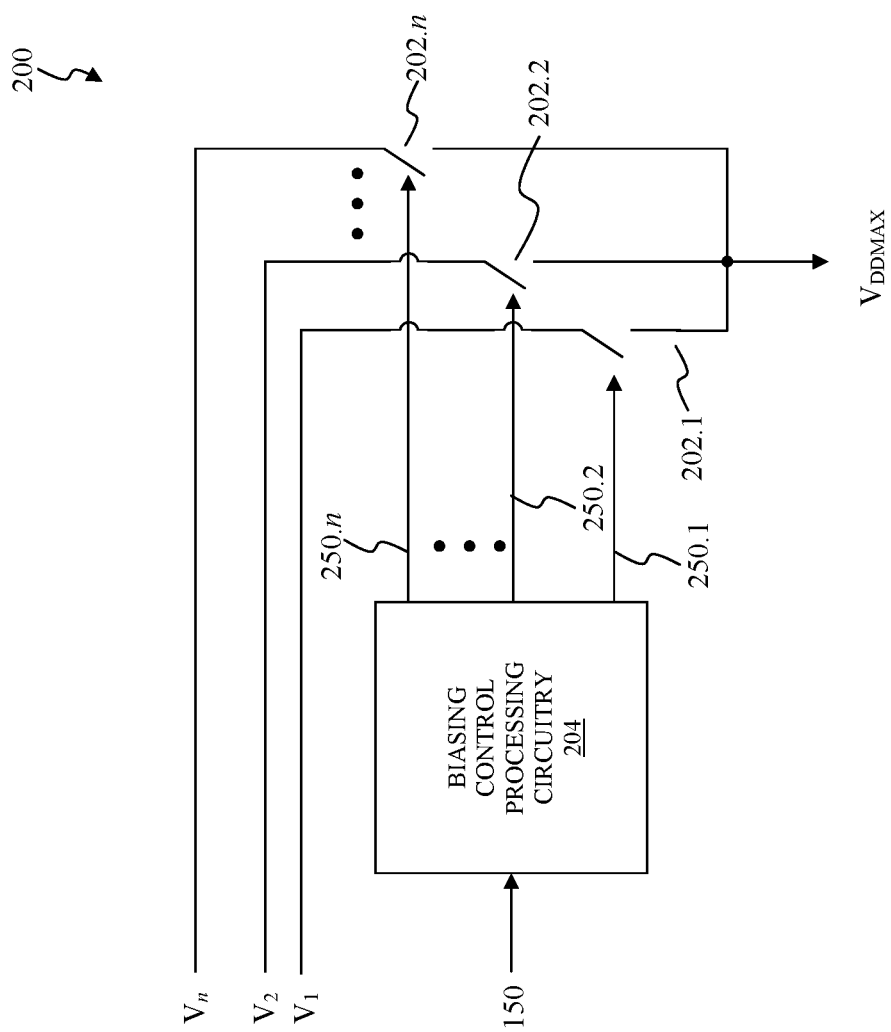
FIG. 2 illustrates a block diagram of a first exemplary biasing circuitry within the exemplary memory storage system according to an exemplary embodiment of the present disclosure.

FIG. 2 illustrates a block diagram of a first exemplary biasing circuitry within the exemplary memory storage system according to an exemplary embodiment of the present disclosure. Biasing circuitry 200 selectively provides the maximum operating voltage signal $V_{DDMAX}$ from among the operational voltage signals $V_1$ through $V_n$ to selection circuitry, such as the selection circuitry 104 to provide an example, in a substantially similar manner as the biasing circuitry 102 as discussed above in FIG. 1. The maximum operating voltage signal $V_{DDMAX}$ ensures multiple switches within the selection circuitry 104 properly open and/close to selectively provide the operating voltage $V_{DDOPERATING}$ from among the operational voltage signals $V_1$ through $V_n$ as discussed above in FIG. 1. In the exemplary illustrated in FIG. 2, the biasing circuitry 200 includes switches 202.1 through 202.n and biasing control processing circuitry 204. The biasing circuitry 200 can represent an exemplary embodiment of the biasing circuitry 102.

The switches 202.1 through 202.n selectively provide their corresponding operational voltage signals $V_1$ through $V_n$ as the maximum operating voltage signal $V_{DDMAX}$. In an exemplary embodiment, the biasing control signal 150 and/or the switching control signals 250.1 through 250.n activate, namely, close, one or more of the switches 202.1 through 202.n when at a first logical level, such as a logical zero to provide an example, and/or deactivate, namely, open, remaining switches from among the switches 202.1 through 202.n when at a second logical level, such as a logical one to provide an example. In this exemplary embodiment, the switches 202.1 through 202.n, when activated, selectively provide their operational voltage signals from among the operational voltage signals $V_1$ through $V_n$ as the maximum operating voltage signal $V_{DDMAX}$. Also, in this exemplary embodiment, the switches 202.1 through 202.n, when deactivated, are selectively prohibited from providing their operational voltage signals from among the operational voltage signals $V_1$ through $V_n$. In another exemplary embodiment, the switches 202.1 through 202.n are implemented using p-type metal-oxide-semiconductor (PMOS) transistors; however, those skilled in the relevant arts will recognize that other implementations, such as n-type metal-oxide-semiconductor (NMOS) transistors, analog switches, or digital switches having one or more logic gates to provide some examples, are possible without departing from the spirit and scope of the present disclosure.

The biasing control processing circuitry 204 provides the switching control signals 250.1 through 250.n in accordance with the biasing control signal 150. As discussed above in FIG. 1, various combinations of the one or more control bits of the biasing control signal 150 correspond to various operational voltage signals from among the operational voltage signals $V_1$ through $V_n$. The biasing control processing circuitry 204 provides the switching control signals 250.1 through 250.n to cause the switches 202.1 through 202.n to selectively provide operational voltage signals from among the operational voltage signals $V_1$ through $V_n$ that correspond to the one or more control bits of the biasing control signal 150. In an exemplary embodiment, the switching control signals 250.1 through 250.n cause the switches 202.1 through 202.n to selectively provide a greatest one of the operational voltage signals $V_1$ through $V_n$ as the maximum operating voltage signal $V_{DDMAX}$. In another exemplary embodiment, the biasing control signal 150 can be switched during operation of the memory storage system 100 to dynamically configure the memory device 106 on the fly to select different operational voltage signals from among the operational voltage signals $V_1$ through $V_n$. For example, the switches 202.1 through 202.n can be configured to provide a first operational voltage signal from among the operational voltage signals $V_1$ through $V_n$ as the maximum operating voltage signal $V_{DDMAX}$ and be dynamically re-configured on the fly to provide a second operational voltage signal from among the operational voltage signals $V_1$ through $V_n$ as the maximum operating voltage signal $V_{DDMAX}$.

Second Exemplary Biasing Circuitry

Figure 3:
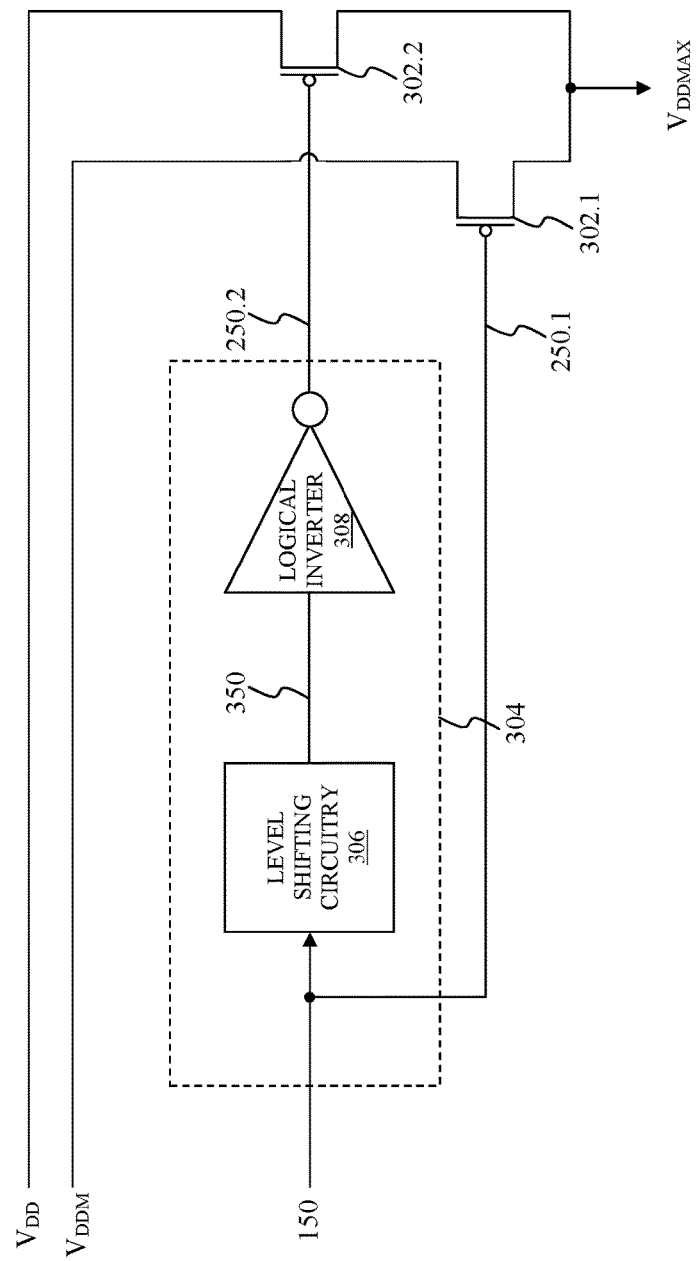
FIG. 3 illustrates a block diagram of a second exemplary biasing circuitry within the exemplary memory storage system according to an exemplary embodiment of the present disclosure.

FIG. 3 illustrates a block diagram of a second exemplary biasing circuitry within the exemplary memory storage system according to an exemplary embodiment of the present disclosure. Biasing circuitry 300 selectively provides a greater one of operational voltage signals $V_{DDM}$ and $V_{DD}$ as the maximum operating voltage signal $V_{DDMAX}$ in a substantially similar manner as the biasing circuitry 102 as discussed above in FIG. 1 and/or the biasing circuitry 200 as discussed above in FIG. 2. In the exemplary illustrated in FIG. 3, the biasing circuitry 300 includes switches 302.1 and 302.2 and biasing control processing circuitry 304. The biasing circuitry 300 can represent an exemplary embodiment of the biasing circuitry 102 and/or the biasing circuitry 200. As such, the operational voltage signals $V_{DDM}$ and $V_{DD}$ can represent exemplary embodiments of two of the operational voltage signals $V_1$ through $V_n$.

The switches 302.1 and 302.2 selectively provide their corresponding operational voltage signals $V_{DDM}$ and $V_{DD}$ as the maximum operating voltage signal $V_{DDMAX}$ in a substantially similar manner as the switches 202.1 through 202.n selectively provide their corresponding operational voltage signals $V_{DDM}$ and $V_{DD}$ as the maximum operating voltage signal $V_{DDMAX}$ described above in FIG. 2. In an exemplary embodiment, the switching control signals 250.1 and 250.2 activate, namely, close, one or more of the switches 302.1 and 302.2 when at a first logical level, such as a logical zero to provide an example, and/or deactivate, namely, open, remaining switches from among the switches 302.1 and 302.2 when at a second logical level, such as a logical one to provide an example. In this exemplary embodiment, the switches 302.1 and 302.2, when activated, selectively provide their operational voltage signals from among the operational voltage signals $V_{DDM}$ and $V_{DD}$ as the maximum operating voltage signal $V_{DDMAX}$. In another exemplary embodiment, the switch 302.1 and the switch 302.2 are complementary switches, namely, the switch 302.1 is closed and the switch 302.2 is open or the switch 302.1 is open and the switch 302.2 is closed, to provide the greater one of operational voltage signals $V_{DDM}$ and $V_{DD}$ as the maximum operating voltage signal $V_{DDMAX}$. In a further exemplary embodiment, the switches 302.1 and 302.2 are implemented using p-type metal-oxide-semiconductor (PMOS) transistors. The switches 302.1 and 302.2 can represent an exemplary embodiment of two switches from among the switches 202.1 through 202.n as described above in FIG. 2.

In the exemplary embodiment illustrated in FIG. 3, the biasing control processing circuitry 304 includes level shifting circuitry 306 and a logical inverter 308. In this exemplary embodiment, the biasing control processing circuitry 304 provides the biasing control signal 150 as the switching control signal 250.1. Thereafter, the level shifting circuitry 306 shifts the biasing control signal 150 to a domain corresponding to the maximum operating voltage signal $V_{DDMAX}$ to provide a level shifted selection control signal 350 to ensure the switch 302.2 can properly open and/close in response to the biasing control signal 150. The logical inverter 308 performs a logical inverting operation on the level shifted biasing control signal 350 to provide the switching control signal 250.2 at the first logical level to activate, namely, close, the switch 302.2 or at the second logical level corresponding to the maximum operating voltage signal $V_{DDMAX}$ to deactivate, namely, open, the switch 302.2. The biasing control processing circuitry 304 can represent an exemplary embodiment of the biasing control processing circuitry 204 as described above in FIG. 2.

First Exemplary Selection Circuitry

Figure 4:
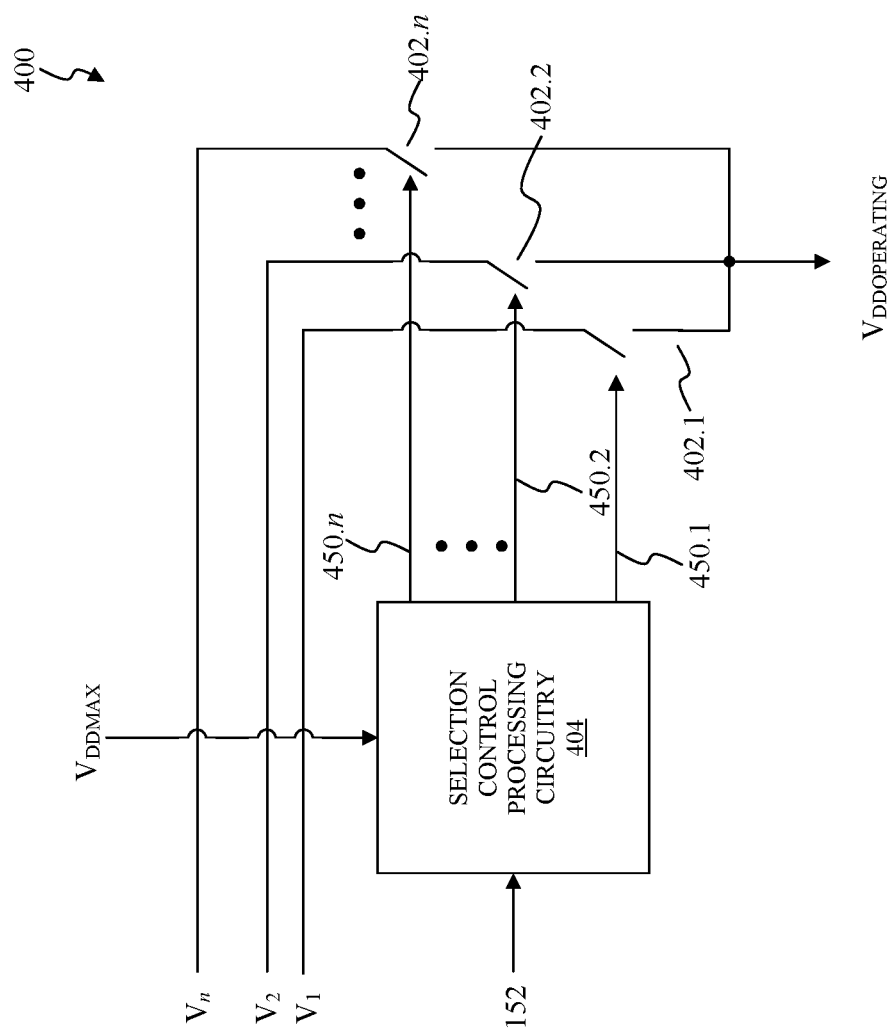
FIG. 4 illustrates a block diagram of a first exemplary selection circuitry within the exemplary memory storage system according to an exemplary embodiment of the present disclosure.

FIG. 4 illustrates a block diagram of a first exemplary selection circuitry within the exemplary memory storage system according to an exemplary embodiment of the present disclosure. Selection circuitry 400 selectively provides the operating voltage $V_{DDOPERATING}$ from among the operational voltage signals $V_1$ through $V_n$ to a memory device, such as the memory device 106 to provide an example, in a substantially similar manner as the selection circuitry 104 as discussed above in FIG. 1. In the exemplary illustrated in FIG. 4, the selection circuitry 400 includes switches 402.1 through 402.n and selection control processing circuitry 404. The selection circuitry 400 can represent an exemplary embodiment of the selection circuitry 104.

The switches 402.1 through 402.n selectively provide their corresponding operational voltage signals $V_1$ through $V_n$ as the operating voltage $V_{DDOPERATING}$. In an exemplary embodiment, the switching control signals 450.1 through 450.n activate, namely, close, one or more of the switches 402.1 through 402.n when at a first logical level, such as a logical zero to provide an example, and/or deactivate, namely, open, remaining switches from among the switches 402.1 through 402.n when at a second logical level, such as a logical one to provide an example. In this exemplary embodiment, the switches 402.1 through 402.n, when activated, selectively provide their operational voltage signals from among the operational voltage signals $V_1$ through $V_n$ as the operating voltage $V_{DDOPERATING}$. Also in this exemplary embodiment, the switches 402.1 through 402.n, when deactivated, are prohibited from selectively providing their operational voltage signals from among the operational voltage signals $V_1$ through $V_n$. In another exemplary embodiment, the switches 402.1 through 402.n are implemented using p-type metal-oxide-semiconductor (PMOS) transistors; however, those skilled in the relevant arts will recognize that other implementations, such as n-type metal-oxide-semiconductor (NMOS) transistors, analog switches, or digital switches having one or more logic gates to provide some examples, are possible without departing from the spirit and scope of the present disclosure.

The selection control processing circuitry 404 provides the switching control signals 450.1 through 450.n in accordance with the selection control signal 152. The selection control processing circuitry 404 provides the switching control signals 450.1 through 450.n to cause the switches 402.1 through 402.n to selectively provide operational voltage signals from among the operational voltage signals $V_1$ through $V_n$ that correspond to the one or more control bits of the selection control signal 152. In an exemplary embodiment, the selection control processing circuitry 404 provides the switching control signals 450.1 through 450.n to cause the switches 402.1 through 402.n to selectively provide a first operational voltage signal, such as a largest one of the operational voltage signals $V_1$ through $V_n$ to provide an example, from among the operational voltage signals $V_1$ through $V_n$ to configure the memory device to dynamically control, for example, maximize, one or more operational parameters, such as read/write speed, from among multiple operational parameters of the memory device. As another example, the memory storage system 100 can select a second operational voltage signal, such as a smallest one of the operational voltage signals $V_1$ through $V_n$ to provide an example, from among the operational voltage signals $V_1$ through $V_n$. In this other example, the second operational voltage signal can be used to configure the memory device to dynamically control, for example, minimize, one or more operational parameters, such as power consumption, from among multiple operational parameters of the memory device. In some situations, the selection control signal 152 can be referenced to one or more operational voltage signals other than the largest one of the operational voltage signals $V_1$ through $V_n$ from among the operational voltage signals $V_1$ through $V_n$. For example, the selection control signal 152 can be provided by one or more processors operating at voltages other than the largest one of the operational voltage signals $V_1$ through $V_n$. In these situations, the selection control processing circuitry 404 shifts voltage levels of the switching control signals 450.1 through 450.n corresponding to the logical ones to the maximum operating voltage signal $V_{DDMAX}$ to ensure the switching control signals 450.1 through 450.n are of sufficient magnitude to activate and/or deactivate the switches 402.1 through 402.n. In another exemplary embodiment, the selection control signal 152 can be switched during operation of the memory storage system 100 to dynamically configure the memory device on the fly to select different operational voltage signals from among the operational voltage signals $V_1$ through $V_n$. For example, the selection control processing circuitry 404 can configure the switching control signals 450.1 through 450.n to cause the switches 402.1 through 402.n to provide a first operational voltage signal from among the operational voltage signals $V_1$ through $V_n$ as the operating voltage $V_{DDOPERATING}$ and be dynamically re-configured on the fly to cause the switches 402.1 through 402.n to provide a second operational voltage signal from among the operational voltage signals $V_1$ through $V_n$ as the operating voltage $V_{DDOPERATING}$. In this example, the selection control processing circuitry 404 can configure the switching control signals 450.1 through 450.n to cause the switches 402.1 through 402.n to provide the largest one of the operational voltage signals $V_1$ through $V_n$ as the operating voltage $V_{DDOPERATING}$. This can maximize the read/write speed of the memory device. The switching control signals 450.1 through 450.n be dynamically re-configured on the fly to cause the switches 402.1 through 402.n to provide the smallest one of the operational voltage signals $V_1$ through $V_n$ as the operating voltage $V_{DDOPERATING}$ to minimize the read/write speed of the memory device.

Second Exemplary Selection Circuitry

Figure 5:
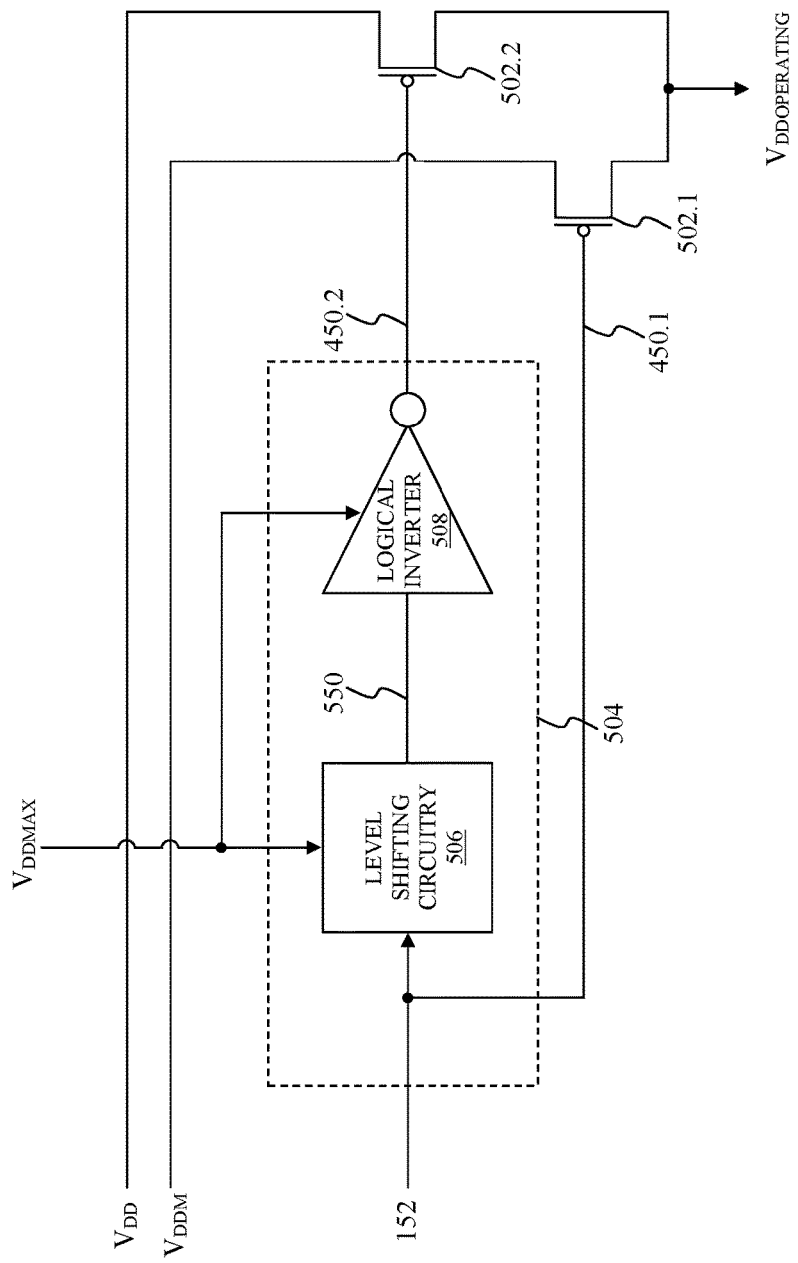
FIG. 5 illustrates a block diagram of a second exemplary selection circuitry within the exemplary memory storage system according to an exemplary embodiment of the present disclosure.

FIG. 5 illustrates a block diagram of a second exemplary selection circuitry within the exemplary memory storage system according to an exemplary embodiment of the present disclosure. Selection circuitry 500 selectively provides the operating voltage $V_{DDOPERATING}$ from among operational voltage signals $V_{DDM}$ and $V_{DD}$ to a memory device, such as the memory device 106 to provide an example, in a substantially similar manner as the selection circuitry 104 as discussed above in FIG. 1 and/or the selection circuitry 400 as discussed above in FIG. 4. In the exemplary illustrated in FIG. 5, the selection circuitry 500 includes switches 502.1 and 502.2 and selection control processing circuitry 504. The selection circuitry 500 can represent an exemplary embodiment of the selection circuitry 104 as described above in FIG. 1 and/or the selection circuitry 400 as described above in FIG. 4. As such, the operational voltage signals $V_{DDM}$ and $V_{DD}$ can represent exemplary embodiments of two of the operational voltage signals $V_1$ through $V_n$.

The switches 502.1 and 502.2 selectively provide their corresponding operational voltage signals $V_{DDM}$ and $V_{DD}$ as the operating voltage $V_{DDOPERATING}$ in a substantially similar manner as the switches 402.1 through 402.n selectively provide their corresponding operational voltage signals $V_{DDM}$ and $V_{DD}$ as the operating voltage $V_{DDOPERATING}$ described above in FIG. 4. In an exemplary embodiment, the switching control signals 450.1 and 450.2 activate, namely, close, one or more of the switches 502.1 and 502.2 when at a first logical level, such as a logical zero to provide an example, and/or deactivate, namely, open, remaining switches from among the switches 502.1 and 502.2 when at a second logical level, such as a logical one to provide an example. In this exemplary embodiment, the switches 502.1 and 502.2, when activated, selectively provide their operational voltage signals from among the operational voltage signals $V_{DDM}$ and $V_{DD}$ as the operating voltage $V_{DDOPERATING}$. In another exemplary embodiment, the switch 502.1 and the switch 502.2 are complementary switches, namely, the switch 502.1 is closed and the switch 502.2 is open or the switch 502.1 is open and the switch 502.2 is closed, to provide their corresponding operational voltage signals $V_{DDM}$ and $V_{DD}$ as the operating voltage $V_{DDOPERATING}$. In a further exemplary embodiment, the switches 502.1 and 502.2 are implemented using p-type metal-oxide-semiconductor (PMOS) transistors. The switches 502.1 and 502.2 can represent an exemplary embodiment of two switches from among the switches 402.1 through 402.n as described above in FIG. 4.

In the exemplary embodiment illustrated in FIG. 5, the selection control processing circuitry 504 includes level shifting circuitry 506 and a logical inverter 508. In this exemplary embodiment, the selection control processing circuitry 504 provides the selection control signal 152 as the switching control signal 450.1. Thereafter, the level shifting circuitry 506 shifts the selection control signal 152 to a domain corresponding to the maximum operating voltage signal $V_{DDMAX}$ to provide a level shifted selection control signal 550. For example, the level shifting circuitry 506 shifts a voltage level of the selection control signal 152 to provide the level shifted selection control signal 550. The logical inverter 508 performs a logical inverting operation on the level shifted selection control signal 550 to provide the switching control signal 450.2 to be complementary to the selection control signal 152. In some situations, the selection control signal 152 can be referenced to the operational voltage signals $V_{DDM}$ and $V_{DD}$, namely referenced to the $V_{DD}$ domain. In these situations, the level shifting circuitry 506 and/or the logical inverter 508 shifts voltage levels of the level shifted selection control signal 550 and the switching control signal 450.2, respectively, corresponding to the logical ones to the maximum operating voltage signal $V_{DDMAX}$ to ensure the switching control signal 450.2 is of sufficient magnitude to activate and/or deactivate the switches 502.2. The selection control processing circuitry 504 can represent an exemplary embodiment of the selection control processing circuitry 404 as described above in FIG. 4.

Figure 6A:
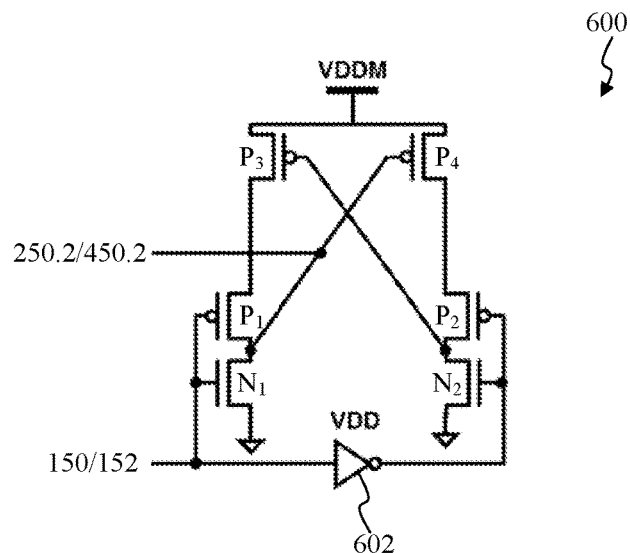
FIG. 6A through FIG. 6H illustrate block diagrams of exemplary control processing circuitry within the exemplary memory storage system according to exemplary embodiments of the present disclosure.
Figure 6B:
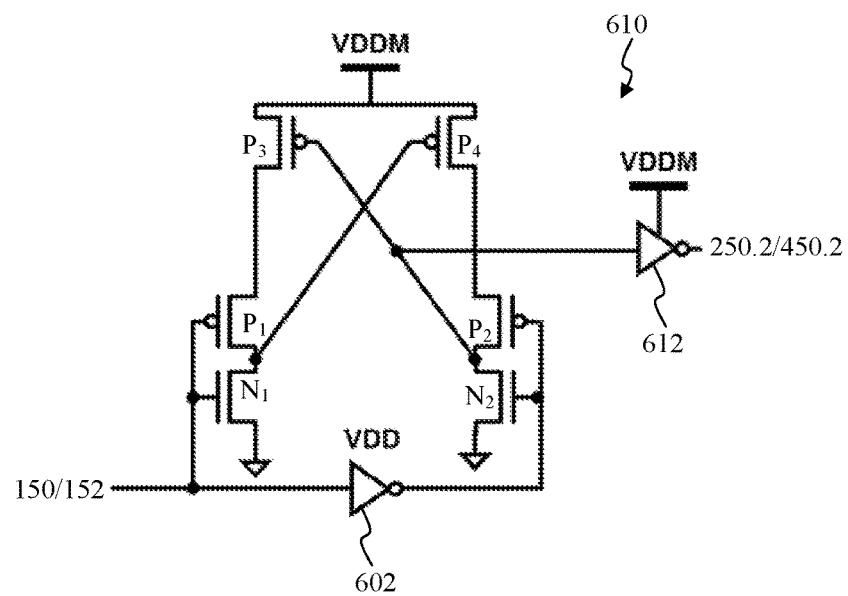
Figure 6C:
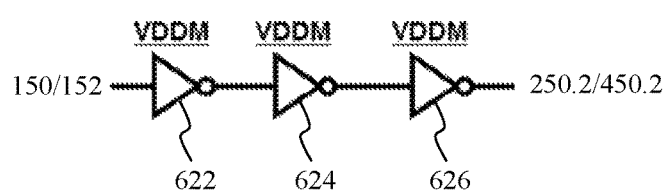
Figure 6D:
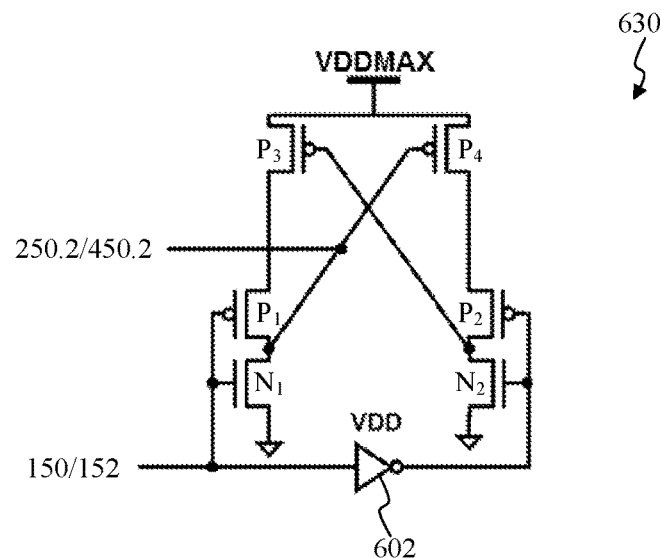
Figure 6E:
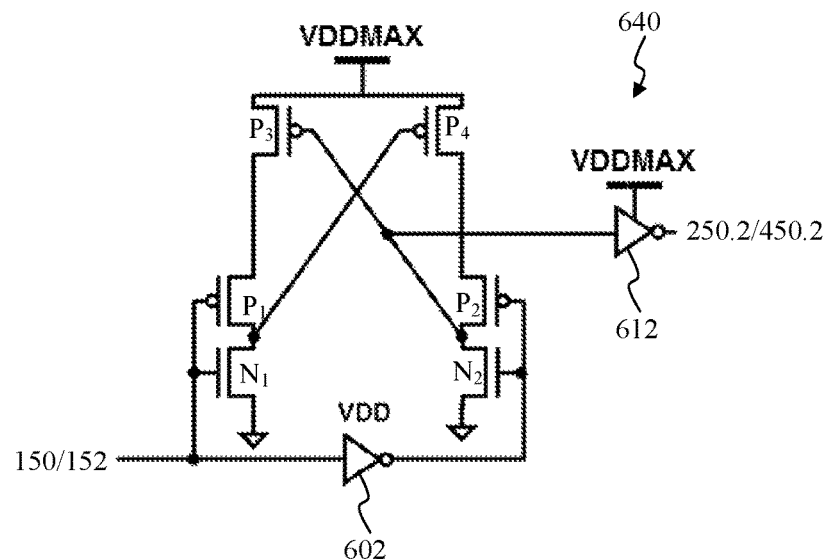
Figure 6F:
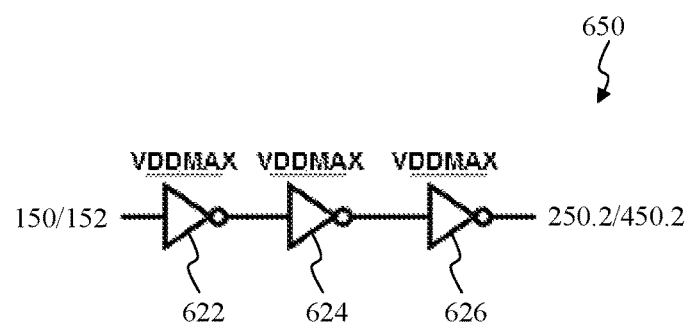
Figure 6G:
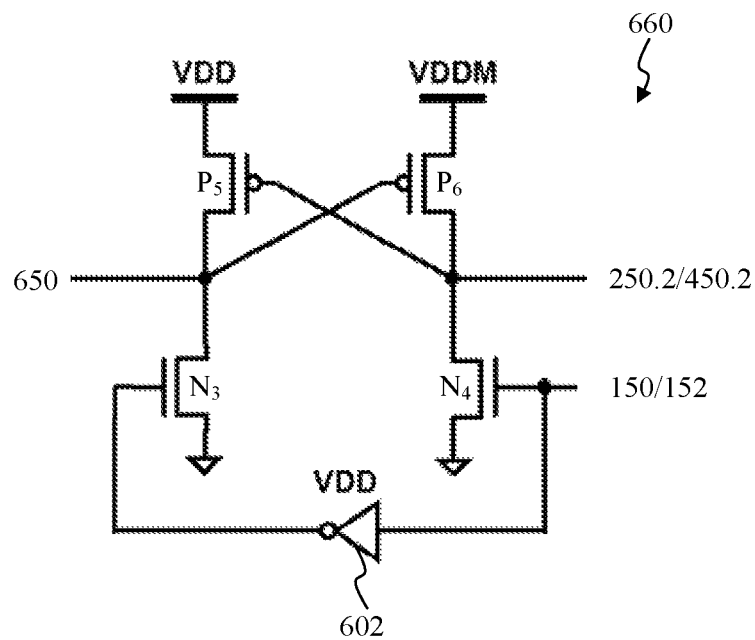
Figure 6H:
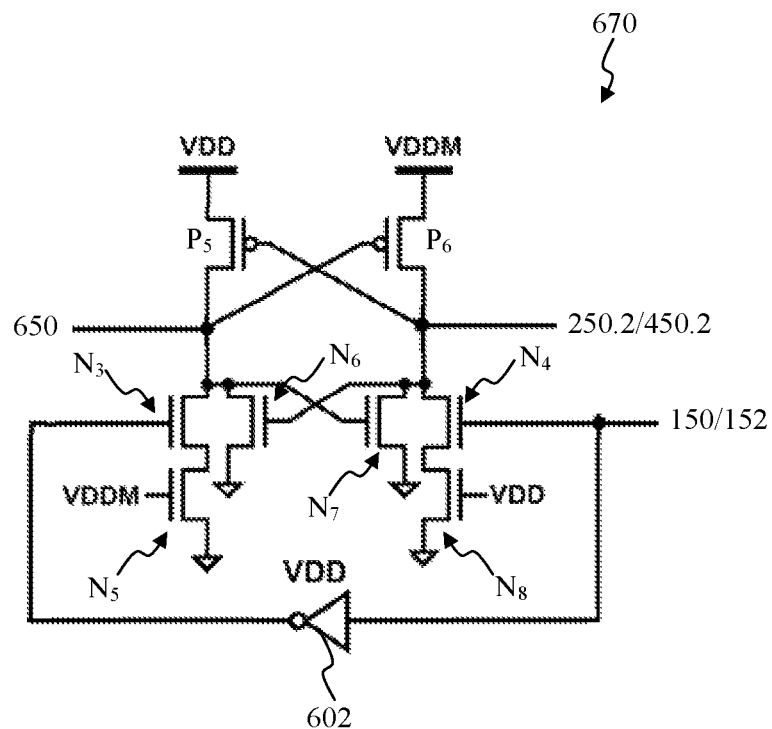

Exemplary Control Processing Circuitry within the Exemplary Memory Storage System FIG. 6A through FIG. 6H illustrate block diagrams of exemplary control processing circuitry within the exemplary memory storage system according to exemplary embodiments of the present disclosure. Power processing circuitry 600 as illustrated in FIG. 6A, power processing circuitry 610 as illustrated in FIG. 6B, power processing circuitry 620 as illustrated in FIG. 6C, power processing circuitry 630 as illustrated in FIG. 6D, power processing circuitry 640 as illustrated in FIG. 6E, power processing circuitry 650 as illustrated in FIG. 6F, power processing circuitry 660 as illustrated in FIG. 6G, and power processing circuitry 670 as illustrated in FIG. 6H provide the switching control signal 250.2 in a substantially similar manner as described above in FIG. 3 and/or the switching control signal 450.2 in a substantially similar manner as described above in FIG. 5. As such, the power processing circuitry 600, the power processing circuitry 610, the power processing circuitry 620, the power processing circuitry 630, the power processing circuitry 640, the power processing circuitry 650, the power processing circuitry 660, and the power processing circuitry 670 can represent exemplary embodiments of biasing control processing circuitry 304 as described above in FIG. 3 and/or the selection control processing circuitry 504 as described above in FIG. 5.

As illustrated in FIG. 6A, the power processing circuitry 600 includes PMOS transistors P1 through P4 and NMOS transistors N1 and N2. The PMOS transistor P1 and the NMOS transistor N1 are configured and arranged to form first logical inverter circuitry. The PMOS transistor P2 and the NMOS transistor N2 are configured and arranged to form second logical inverter circuitry. The PMOS transistor P3 forms a first switch between the first logical inverter circuitry and the operational voltage signal $V_{DDM}$ and the PMOS transistor P4 forms a switch between the second logical inverter circuitry and the operational voltage signal $V_{DDM}$. During operation, a third logical inverter 602 inverts the biasing control signal 150 and/or the selection control signal 152. When the biasing control signal 150 and/or the selection control signal 152 is at a logical zero in the $V_{DD}$ domain, the PMOS transistor P1 and the NMOS transistor N2 are activated and the PMOS transistor P2 and the NMOS transistor N1 are deactivated. In this situation, the PMOS transistor P3 is activated and the PMOS transistor P4 is deactivated switching the switching control signal 250.2 and/or the switching control signal 450.2 to be at the operational voltage signal $V_{DDM}$, namely, a logical one in the $V_{DDM}$ domain. However, when the biasing control signal 150 and/or the selection control signal 152 is at a logical one in the $V_{DD}$ domain, the PMOS transistor P1 and the NMOS transistor N2 are deactivated and the PMOS transistor P2 and the NMOS transistor N1 are activated. In this situation, the PMOS transistor P3 is deactivated and the PMOS transistor P4 is activated switching the switching control signal 250.2 and/or the switching control signal 450.2 to be at the ground potential, namely, logical zero.

As illustrated in FIG. 6B, the power processing circuitry 610 includes the PMOS transistors P1 through P4 and the NMOS transistors N1 and N2. During operation, the third logical inverter 602 inverts the biasing control signal 150 and/or the selection control signal 152. When the biasing control signal 150 and/or the selection control signal 152 is at a logical zero in the $V_{DD}$ domain, the PMOS transistor P1 and the NMOS transistor N2 are activated and the PMOS transistor P2 and the NMOS transistor N1 are deactivated. In this situation, the PMOS transistor P3 is activated and the PMOS transistor P4 is deactivated applying the ground potential, namely, a logical zero, to an input of a fourth logical inverter 612. The fourth logical inverter 612 performs a logical inverting operation on the ground potential to provide the switching control signal 250.2 and/or the switching control signal 450.2 at the operational voltage signal $V_{DDM}$, namely, logical one in the $V_{DDM}$ domain. However, when the biasing control signal 150 and/or the selection control signal 152 is at a logical one in the $V_{DD}$ domain, the PMOS transistor P1 and the NMOS transistor N2 are deactivated and the PMOS transistor P2 and the NMOS transistor N1 are activated. In this situation, the PMOS transistor P3 is deactivated and the PMOS transistor P4 is activated applying the operational voltage signal $V_{DDM}$ to the input of a fourth logical inverter 612. The fourth logical inverter 612 performs the logical inverting operation on the operational voltage signal $V_{DDM}$ to provide the switching control signal 250.2 and/or the switching control signal 450.2 at the ground potential, namely, logical zero.

As illustrated in FIG. 6C, the power processing circuitry 620 includes a fifth logical inverter 622, a sixth logical inverter 624, and a seventh logical inverter 626. When the biasing control signal 150 and/or the selection control signal 152 is at a logical zero in the $V_{DD}$ domain, the fifth logical inverter 622, the sixth logical inverter 624, and the seventh logical inverter 626 perform a series of logical operations on the biasing control signal 150 and/or the selection control signal 152 to cause the switching control signal 250.2 and/or the switching control signal 450.2 to be at the operational voltage signal $V_{DDM}$, namely, a logical one in the $V_{DDM}$ domain. However, when the biasing control signal 150 and/or the selection control signal 152 is at a logical one in the $V_{DD}$ domain, the fifth logical inverter 622, the sixth logical inverter 624, and the seventh logical inverter 626 perform the series of logical operations on the biasing control signal 150 and/or the selection control signal 152 to cause the switching control signal 250.2 and/or the switching control signal 450.2 to be at the ground potential, namely, logical zero.

As illustrated in FIG. 6D, the power processing circuitry 630 includes the PMOS transistors P1 through P4 and the NMOS transistors N1 and N2. The power processing circuitry 630 operates in a substantially similar manner as the power processing circuitry 600 as described above in FIG. 6A. However, when the biasing control signal 150 and/or the selection control signal 152 is at a logical zero in a domain corresponding to the greater one of the operational voltage signals $V_{DDM}$ and $V_{DD}$, referred to as the $V_{DDMAX}$ domain, the switching control signal 250.2 and/or the switching control signal 450.2 is at the greater one of the operational voltage signals $V_{DDM}$ and $V_{DD}$, namely, a logical one in the $V_{DDMAX}$ domain.

As illustrated in FIG. 6E, the power processing circuitry 640 includes the PMOS transistors P1 through P4 and the NMOS transistors N1 and N2. The power processing circuitry 660 operates in a substantially similar manner as the power processing circuitry 610 as described above in FIG. 6B. However, when the biasing control signal 150 and/or the selection control signal 152 is at a logical zero in the $V_{DDMAX}$ domain, the ground potential, namely, a logical zero, is applied to the input of the fourth logical inverter 612. The fourth logical inverter 612 performs the logical inverting operation on the ground potential to provide the switching control signal 250.2 and/or the switching control signal 450.2 at the greater one of the operational voltage signals $V_{DDM}$ and $V_{DD}$, namely, logical one in the $V_{DDMAX}$ domain.

As illustrated in FIG. 6F, the power processing circuitry 650 includes the fifth logical inverter 622, the sixth logical inverter 624, and the seventh logical inverter 626. The power processing circuitry 650 operates in a substantially similar manner as the power processing circuitry 620 as described above in FIG. 6C. However, when the biasing control signal 150 and/or the selection control signal 152 is at a logical zero in the $V_{DDMAX}$ domain, the fifth logical inverter 622, the sixth logical inverter 624, and the seventh logical inverter 626 perform the series of logical operations on the biasing control signal 150 and/or the selection control signal 152 to cause the switching control signal 250.2 and/or the switching control signal 450.2 to be at the greater one of the operational voltage signals $V_{DDM}$ and $V_{DD}$, namely, a logical one in the $V_{DDMAX}$ domain.

As illustrated in FIG. 6G, the power processing circuitry 660 includes PMOS transistors P5 and P6 and NMOS transistors N3 and N4. During operation, the third logical inverter 602 inverts the biasing control signal 150 and/or the selection control signal 152. When the biasing control signal 150 and/or the selection control signal 152 is at a logical zero, the NMOS transistor N3 is activated and the NMOS transistor N4 is deactivated. In this situation, the PMOS transistor P6 is activated and the PMOS transistor P5 is deactivated switching the switching control signal 250.2 and/or the switching control signal 450.2 to be at the operational voltage signal $V_{DDM}$, namely, a logical one in the $V_{DDM}$ domain and a switching control signal 650 to be at the ground potential, namely, logical zero. The switching control signal 650 can be used as a switching control signal to control the switch 202.1 as illustrated in FIG. 2 as a replacement for the biasing control signal 150 and/or the selection control signal 152. However, when the biasing control signal 150 and/or the selection control signal 152 is at a logical one, the NMOS transistor N3 is deactivated and the NMOS transistor N4 is activated. In this situation, the PMOS transistor P6 is deactivated and the PMOS transistor P5 is activated switching the switching control signal 250.2 and/or the switching control signal 450.2 to be at the ground potential, namely, logical zero, and the switching control signal 650 be at the operational voltage signal $V_{DD}$, namely, a logical one in the $V_{DDM}$ domain.

As illustrated in FIG. 6H, the power processing circuitry 670 includes the PMOS transistors P5 and P6, the NMOS transistors N3 and N4, and NMOS transistors N5 through N8. The power processing circuitry 670 operates in a substantially similar manner as the power processing circuitry 660 as described above in FIG. 6G with the inclusion of the NMOS transistors N5 through N8. As illustrated in FIG. 6H, the inclusion of the NMOS transistors N5 through N8 effectively pull-down the switching control signal 250.2 and/or the switching control signal 450.2 to be at the ground potential, namely, logical zero, when the biasing control signal 150 and/or the selection control signal 152 is at a logical zero or pull-down the switching control signal 650 to be at the ground potential, namely, logical zero, when the biasing control signal 150 and/or the selection control signal 152 is at a logical one.

Exemplary Switches within the Exemplary Memory Storage System

Figure 7A:
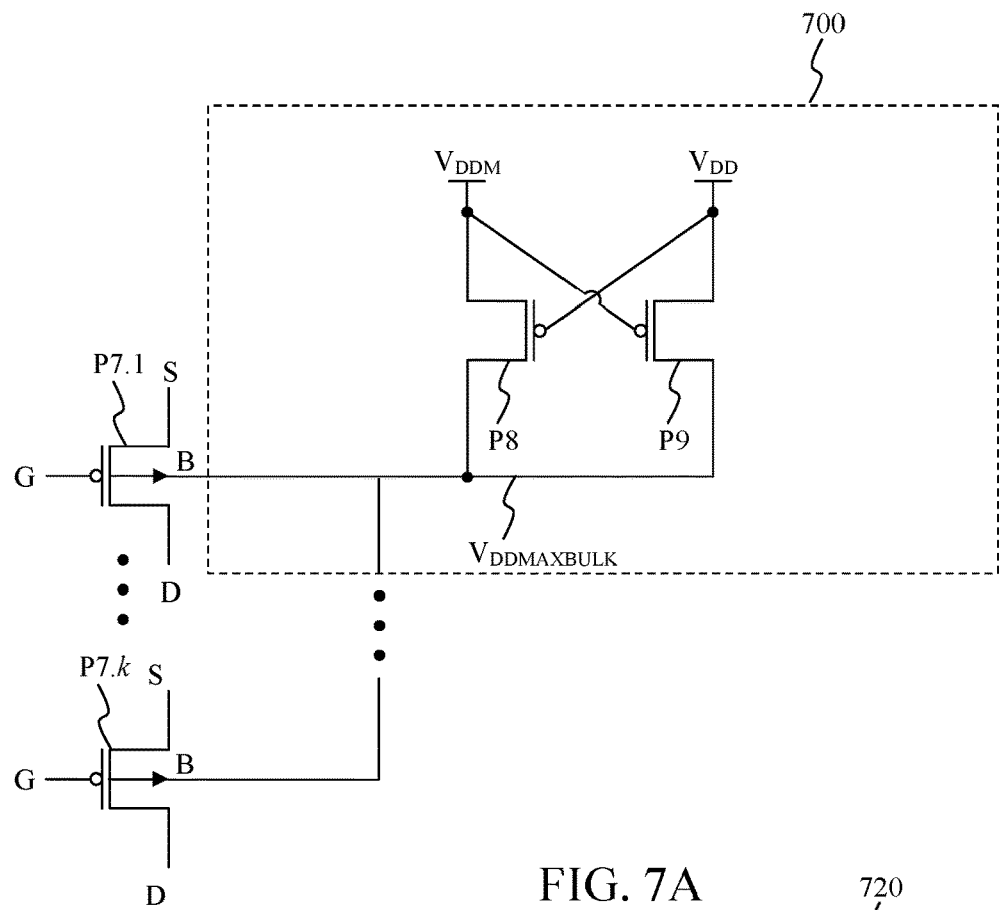
FIG. 7A and FIG. 7B illustrate block diagrams of switches within the exemplary memory storage system according to exemplary embodiments of the present disclosure.
Figure 7B:
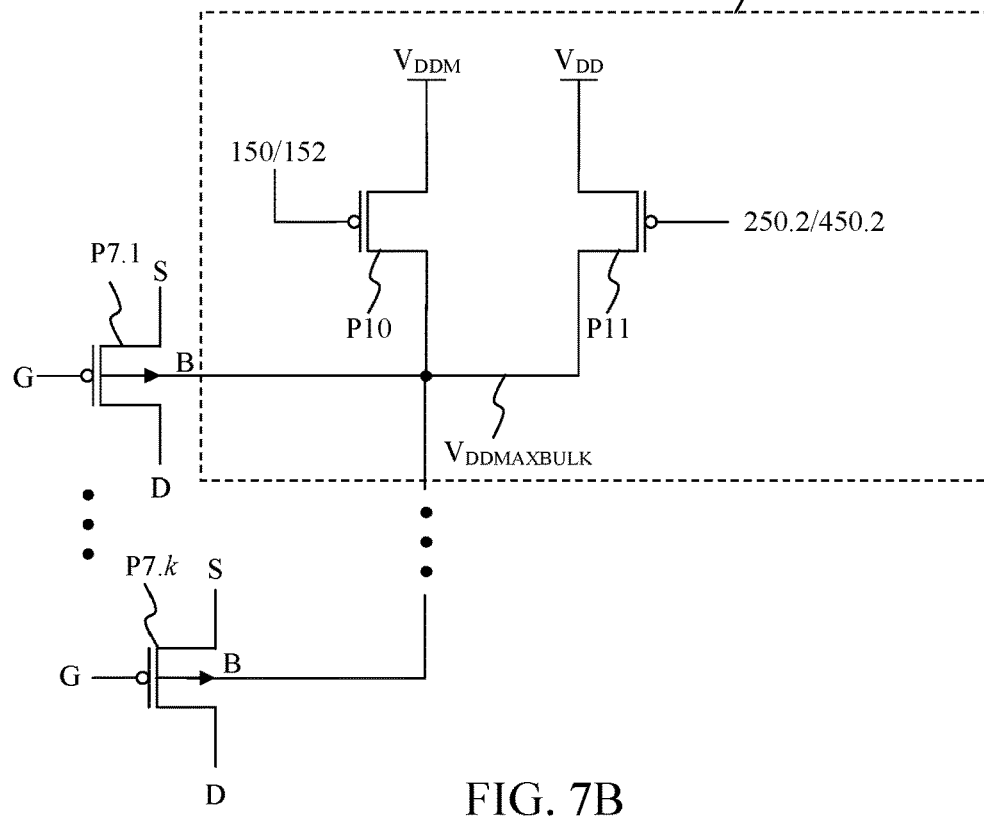

FIG. 7A and FIG. 7B illustrate block diagrams of switches within the exemplary memory storage system according to exemplary embodiments of the present disclosure. As illustrated in FIG. 7A and FIG. 7B, switch bulk biasing circuitry 700 and switch bulk biasing circuitry 720 selectively provides their operational voltage signals $V_1$ through $V_n$ and/or their operational voltage signals $V_{DDM}$ and $V_{DD}$ in a substantially similar manner as the switches 202.1 through 202.n as described above in FIG. 2, the switches 302.1 and 302.2 as described above in FIG. 3, the switches 402.1 through 402.n as described above in FIG. 4, and/or the switches 502.1 and 502.2 as described above in FIG. 5. In the exemplary embodiments illustrated in FIG. 7A and FIG. 7B, the switch bulk biasing circuitry 700 and the switch bulk biasing circuitry 720 are configured and arranged to have a maximum operating voltage signal $V_{DDMAXBULK}$ selected from among the operational voltage signals $V_{DDM}$ and $V_{DD}$ applied to their bulk (B) terminals, also referred to as body terminals, base terminals, or substrate terminals, to prevent latch-up.

As illustrated in FIG. 7A, the switch bulk biasing circuitry 700 includes PMOS P8 and P9 coupled to PMOS transistors P7.1 through P7.$k$. The PMOS transistors P7.1 through P7.$k$ can represent exemplary embodiments of one or more of the switches 202.1 through 202.$n$ as described above in FIG. 2, the switches 302.1 and 302.2 $n$ as described above in FIG. 3, the switches 402.1 through 402.$n$ n as described above in FIG. 4, and/or the switches 502.1 and 502.$n$ as described above in FIG. 5. In the exemplary embodiment illustrated in FIG. 7A, the PMOS transistors P7.1 through P7.$k$ include gate (G) terminals, source (S) terminals, drain (D) terminals, and the bulk (B) terminals. As additionally illustrated in FIG. 7A, the bulk (B) terminals of PMOS transistors P7.1 through P7.$k$ receive the maximum operating voltage signal $V_{DDMAXBULK}$ that is selected from among the operational voltage signals $V_{DDM}$ and $V_{DD}$ by the PMOS transistors P8 and P9. The PMOS transistor P8 is active when the operational voltage signal $V_{DDM}$ is greater than the operational voltage signal $V_{DD}$ causing the maximum operating voltage signal $V_{DDMAXBULK}$ to be the operational voltage signal $V_{DDM}$. Otherwise, the PMOS transistor P9 is active when the operational voltage signal $V_{DD}$ is greater than the operational voltage signal $V_{DDM}$ causing the maximum operating voltage signal $V_{DDMAXBULK}$ to be the operational voltage signal $V_{DD}$.

As illustrated in FIG. 7B, the switch bulk biasing circuitry 720 includes PMOS transistors P10 and P11 coupled to the PMOS transistors P7.1 through P7.$k$. As additionally illustrated in FIG. 7B, the bulk (B) terminals of the PMOS transistors P7.1 through P7.$k$ receive the maximum operating voltage signal $V_{DDMAXBBULK}$ that is selected from among the operational voltage signals $V_{DDM}$ and $V_{DD}$ by the PMOS transistors P10 and P11. In the exemplary embodiment illustrated in FIG. 7B, the biasing control signal 150 and/or the selection control signal 152 activates the PMOS transistor P10 when at a logical zero to selectively provide the operational voltage signal $V_{DDM}$ as the maximum operating voltage signal $V_{DDMAXBULK}$. Also in this exemplary embodiment, the switching control signal 250.2 and/or the switching control signal 450.2 activates the PMOS transistor P11 when at a logical zero to selectively provide the operational voltage signal $V_{DD}$ as the maximum operating voltage signal $V_{DDMAXBULK}$. In another exemplary embodiment, the biasing control signal 150 and/or the selection control signal 152 and the switching control signal 250.2 and/or the switching control signal 450.2 represent complementary switching control signals. In this other exemplary embodiment, only one of the PMOS transistor P10 or the PMOS transistor P11 is activated at a time.

Third Exemplary Selection Circuitry

Figure 8:
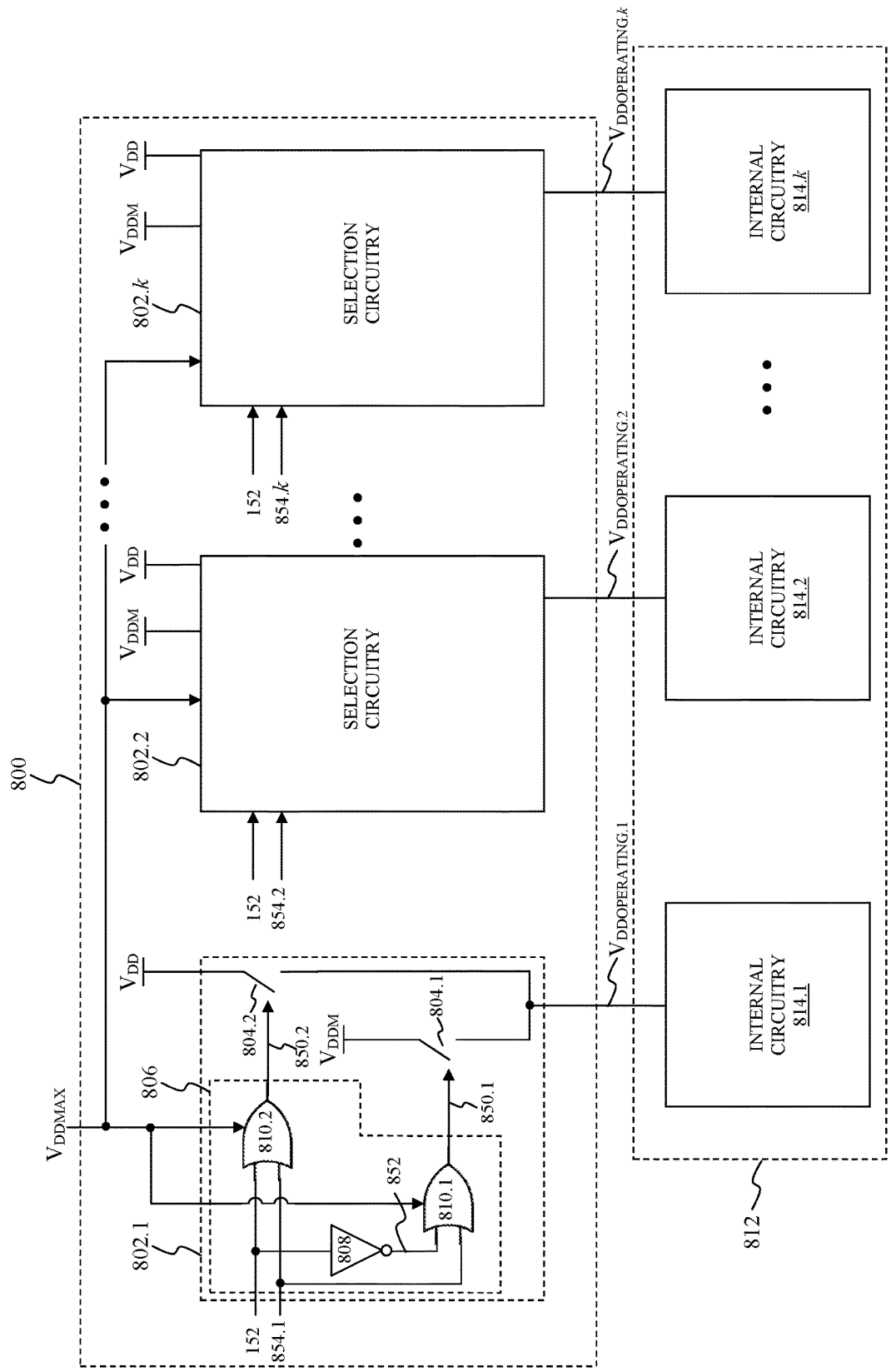
FIG. 8 illustrates a block diagram of a third exemplary selection circuitry within the exemplary memory storage system according to an exemplary embodiment of the present disclosure.

FIG. 8 illustrates a block diagram of a third exemplary selection circuitry within the exemplary memory storage system according to an exemplary embodiment of the present disclosure. As illustrated in FIG. 8, the parallel selection circuitry 800 selectively provides operating voltage signals $V_{DDOPERATING.1}$ through $V_{DDOPERATING.k}$ from among operational voltage signals $V_{DDM}$ and $V_{DD}$ to a memory device, such as the memory device 106 and/or a memory device 812, which is to be discussed in further detail below, to provide some examples, in a substantially similar manner as the selection circuitry 104 as discussed above in FIG. 1. In the exemplary embodiment illustrated in FIG. 8, the parallel selection circuitry 800 includes selection circuitry 802.1 through 802.$k$. The parallel selection circuitry 800 can represent an exemplary embodiment of the selection circuitry 104 as described above in FIG. 1 and/or the selection circuitry 404 as described above in FIG. 4.

The selection circuitry 802.1 through 802.$k$ selectively provide the operating voltage signals $V_{DDOPERATING.1}$ through $V_{DDOPERATING.k}$ from among the operational voltage signals $V_{DDM}$ and $V_{DD}$ to the memory device. In an exemplary embodiment, the read/write speed of the memory device can be maximized by selectively providing a greater one of the operational voltage signals $V_{DDM}$ and $V_{DD}$ as the operating voltage signals $V_{DDOPERATING.1}$ through $V_{DDOPERATING.k}$. As another example, the power consumption of the memory device can be minimized by selectively receiving the lesser one of the operational voltage signals $V_{DDM}$ and $V_{DD}$ as the operating voltage signals $V_{DDOPERATING.1}$ through $V_{DDOPERATING.k}$. In the exemplary embodiment illustrated in FIG. 8, each of the selection circuitry 802.1 through 802.$k$ is similar to one another; therefore, only the selection circuitry 802.1 is to be discussed in further detail below.

As illustrated in FIG. 8, the selection circuitry 802.1 includes switches 804.1 and 804.2 and selection control processing circuitry 806. The switches 804.1 and 804.2 selectively provide their corresponding operational voltage signals $V_{DDM}$ and $V_{DD}$ as the operating voltage $V_{DDOPERATING.1}$ in a substantially similar manner as the switches 402.1 through 402.$n$ selectively provide their corresponding operational voltage signals $V_{DDM}$ and $V_{DD}$ as the operating voltage $V_{DDOPERATING}$ described above in FIG. 4. In an exemplary embodiment, switching control signals 850.1 and 850.2 activate, namely, close, one or more of the switches 804.1 and 804.2 when at a first logical level, such as a logical zero to provide an example, and/or deactivate, namely, open, remaining switches from among the switches 804.1 and 804.2 when at a second logical level, such as a logical one to provide an example. In this exemplary embodiment, the switches 804.1 and 804.2, when activated, selectively provide their operational voltage signals from among the operational voltage signals $V_{DDM}$ and $V_{DD}$ as the operating voltage $V_{DDOPERATING.1}$. In another exemplary embodiment, the switch 804.1 and the switch 804.2 are complementary switches, namely, the switch 804.1 is closed and the switch 804.2 is open or the switch 804.1 is open and the switch 804.2 is closed, to provide their corresponding operational voltage signals $V_{DDM}$ and $V_{DD}$ as the operating voltage $V_{DDOPERATING.1}$. In a further exemplary embodiment, the switches 804.1 and 804.2 are implemented using p-type metal-oxide-semiconductor (PMOS) transistors. The switches 804.1 and 804.2 can represent an exemplary embodiment of two switches from among the switches 402.1 through 402.$n$ as described above in FIG. 4.

In the exemplary embodiment illustrated in FIG. 8, the selection control processing circuitry 806 includes a logical inverter 808, a first logical OR gate 810.1, and a second logical OR gate 810.2; however, those skilled in the relevant art(s) will recognize that other logical gates, such as one or more logical AND gates, one or more logical OR gates, one or more logical INVERTER gates, one or more logical NAND gates, one or more logical NOR gates, or any combination thereof to provide some examples, can alternatively be utilized without departing from the spirit and scope of the present disclosure. The logical inverter 808 performs a logical inverting operation on the selection control signal 152 to provide a complementary selection control signal 852. In the exemplary embodiment illustrated in FIG. 8, the first logical OR gate 810.1 performs a first logical OR operation on the complementary selection control signal 852 and an enable control signal 854.1 from among enable control signals 854.1 through 854.k. The first logical OR gate 810.1 provides the switching control signal 850.1 at a first logical level, such as a logical zero to provide an example, to activate the switch 804.1 when the complementary selection control signal 852 is at the first logical level to select the operational voltage signal $V_{DDM}$ as the operating voltage $V_{DDOPERATING.1}$ and the enable control signal 854.1 is at the first logical level. Otherwise, the first logical OR gate 810.1 provides the switching control signal 850.1 at a second logical level, such as a logical one to provide an example, to deactivate the switch 804.1 when the complementary selection control signal 852 is at the second logical level to select the operational voltage signal $V_{DD}$ as the operating voltage $V_{DDOPERATING.1}$ or the enable control signal 854.1 is at the second logical level. The second logical OR gate 810.2 operates in a substantially similar manner as the first logical OR gate 810.1. As such, the second logical OR gate 810.2 is not to be described in further detail.

The memory device 812 receives the operating voltage signals $V_{DDOPERATING.1}$ through $V_{DDOPERATING.k}$. In the exemplary embodiment illustrated in FIG. 8, the memory device 812 includes internal circuitry 814.1 through 814.k. In an exemplary embodiment, the internal circuitry 814.1 through 814.k includes at least a memory array, column selection circuitry, and/or a write driver to provide some examples. The memory device 812 provides the operating voltage signals $V_{DDOPERATING.1}$ through $V_{DDOPERATING.k}$ to their corresponding internal circuitry from among the internal circuitry 814.1 through 814.k. In another exemplary embodiment, the read/write speed of the memory device 812 can be maximized by selectively receiving a greater one of the operational voltage signals $V_{DDM}$ and $V_{DD}$ as the operating voltage signals $V_{DDOPERATING.1}$ through $V_{DDOPERATING.k}$. In this example, the greater one of the operational voltage signals $V_{DDM}$ and $V_{DD}$ can cause various transistors of the internal circuitry 814.1 through 814.k to turn off and/or on at faster rate when compared to a lesser one of the operational voltage signals $V_{DDM}$ and $V_{DD}$. As another example, the power consumption of the memory device 812 can be minimized by selectively receiving the lesser one of the operational voltage signals $V_{DDM}$ and $V_{DD}$ as the operating voltage signals $V_{DDOPERATING.1}$ through $V_{DDOPERATING.k}$. In this other example, the lesser one of the operational voltage signals $V_{DDM}$ and $V_{DD}$ causes less unwanted leakage among the internal circuitry 814.1 through 814.k when compared to the greater one of the operational voltage signals $V_{DDM}$ and $V_{DD}$.

Exemplary Operation of the Exemplary Memory Storage Systems

Figure 9:
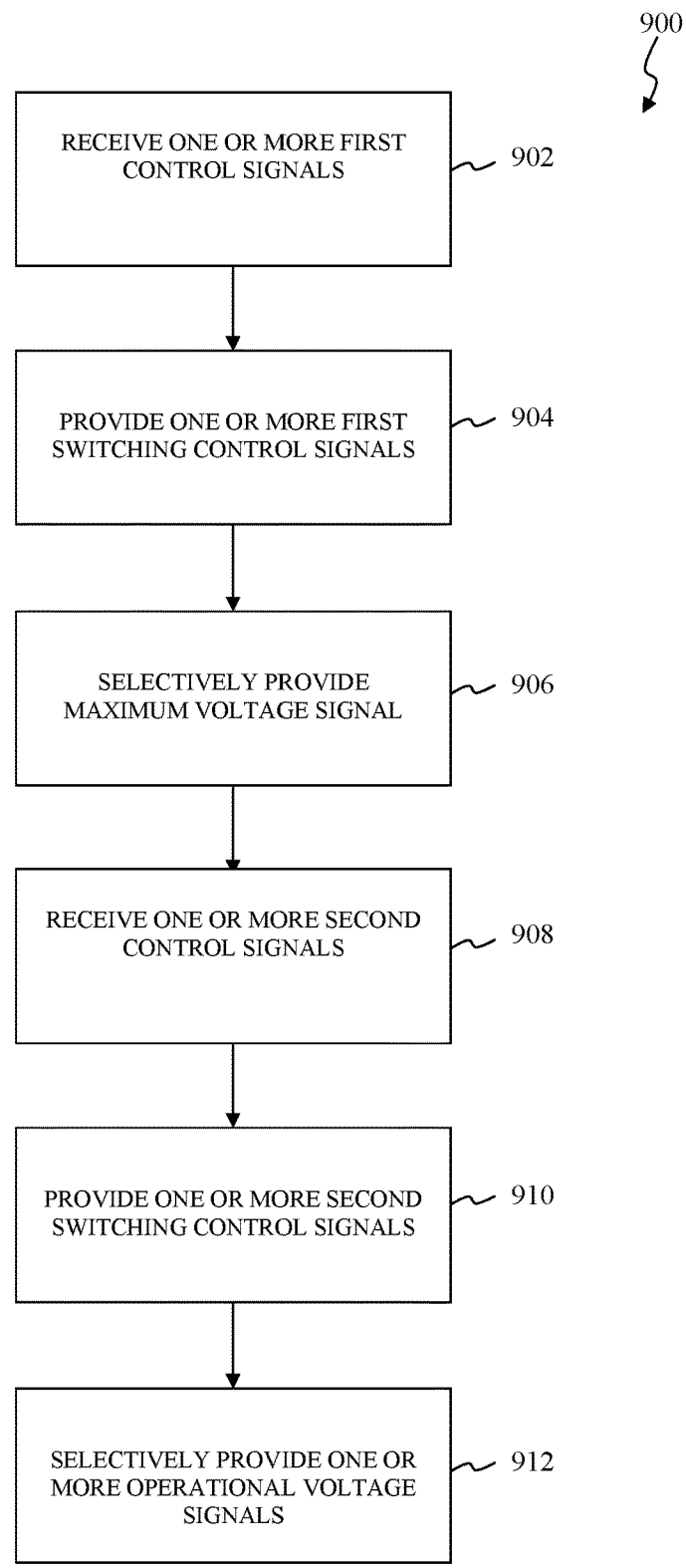
FIG. 9 illustrates a flowchart of an exemplary operation of the exemplary memory storage systems according to an exemplary embodiment of the present disclosure.

FIG. 9 illustrates a flowchart of an exemplary operation of the exemplary memory storage systems according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes exemplary operation flow 900 of a memory storage system, such as the memory storage system 100 or the memory storage system 500 to provide an example.

At operation 902, the exemplary operation flow 900 receives one or more first operational voltage control signals, such as the biasing control signal 150 to provide an example. In an exemplary embodiment, the one or more first operational voltage control signals indicate one or more operational voltage signals from among multiple operational voltage signals, such as the operational voltage signals $V_1$ through $V_n$ and/or the operational voltage signals $V_{DDM}$ and $V_{DD}$ to provide some examples, that are to be selectively chosen by the exemplary operation flow 900. For example, the one or more first operational voltage control signals can indicate that a greatest operational voltage signal from among the operational voltage signals is to be selectively chosen by the exemplary operation flow 900. In an exemplary embodiment, the operation 902 can be performed by the biasing circuitry 102 as described above in FIG. 1, the biasing control processing circuitry 204 as described above in FIG. 2, and/or the biasing control processing circuitry 304 as described above in FIG. 3.

At operation 904, the exemplary operation flow 900 provides one or more first switching control signals, such as one or more of the switching control signals 250.1 through 250.n to provide an example, in accordance with the one or more operational first voltage control signals from operation 902. The one or more switching control signals activate, namely, close, one or more first switches from among multiple switches, such as the switches 202.1 through 202.n, the switches 302.1 and 302.2, and/or the PMOS transistors P7.1 through P7.k to provide some examples, when at a first logical level, such as a logical zero to provide an example, and/or deactivate, namely, open, one or more second switches from among the multiple switches when at a second logical level, such as a logical one to provide an example. In an exemplary embodiment, the operation 904 can be performed by the biasing circuitry 102 as described above in FIG. 1, the biasing control processing circuitry 204 as described above in FIG. 2, and/or the biasing control processing circuitry 304 as described above in FIG. 3.

At operation 906, the exemplary operation flow 900 selectively provides the one or more operational voltage signals from operation 902 as the maximum operating voltage signal $V_{DDMAX}$ in accordance with the one or more first switching control signals from operation 904. The one or more first switches from operation 904, when activated, selectively provide their operational voltage signals from among the one or more operational voltage signals from operation 902 as the maximum operating voltage signal $V_{DDMAX}$. The one or more second switches from operation 904, when deactivated, are selectively prohibited from providing their operational voltage signals from among the one or more operational voltage signals from operation 902. In an exemplary embodiment, the operation 906 can be performed by the switches 202.1 through 202.n as described above in FIG. 2, the switches 302.1 and 302.2 as described above in FIG. 3, and/or the PMOS transistors P7.1 through P7.k as described above in FIG. 7A and FIG. 7B to provide some examples.

At operation 908, the exemplary operation flow 900 receives one or more second operational voltage control signals, such as the selection control signal 152 to provide an example. In an exemplary embodiment, the one or more second operational voltage control signals indicate one or more operational voltage signals from among multiple operational voltage signals, such as the operational voltage signals $V_1$ through $V_n$ and/or the operational voltage signals $V_{DDM}$ and $V_{DD}$ to provide some examples, that are to be provided to a memory device, such as the memory device 106 and/or the memory device 812 to provide some examples. In some situations, the one or more second operational voltage control signals can indicate one or more operational parameters from among multiple operational parameters, such as power consumption or read/write speed to provide some examples, of the memory device to be controlled. In an exemplary embodiment, the one or more operational voltage control signals indicate a minimum operating voltage signal from among the multiple operational voltage signals is to be provided to the memory device to minimize the power consumption of the memory device. In another exemplary embodiment, the one or more operational voltage control signals indicate a maximum operating voltage signal from among the multiple operational voltage signals is to be provided to the memory device to maximize the read/write speed of the memory device.

At operation 910, the exemplary operation flow 900 provides one or more second switching control signals, such as one or more of the switching control signals 450.1 through 450.n as described above in FIG. 4 and/or the switching control signals 850.1 and 850.2 as described above in FIG. 8 to provide some examples. In an exemplary embodiment, the exemplary operation flow 900 provides the one or more second switching control signals in a domain corresponding to the greater one of the operational voltage signals $V_{DDM}$ and $V_{DD}$, referred to as the $V_{DDMAX}$ domain, in accordance with the maximum operating voltage signal $V_{DDMAX}$ provided in operation 906. The one or more switching control signals activate, namely, close, one or more second switches from among multiple switches, such as the switches 202.1 through 202.n, the switches 302.1 and 302.2, and/or the PMOS transistors P7.1 through P7.k to provide some examples, when at a first logical level, such as a logical zero to provide an example, and/or deactivate, namely, open, one or more second switches from among the multiple switches when at a second logical level, such as a logical one to provide an example. In an exemplary embodiment, the operation 910 can be performed by the selection circuitry 104 as described above in FIG. 1, the selection control processing circuitry 404 as described above in FIG. 4, the selection control processing circuitry 504 as described above in FIG. 5, and/or one or more of the selection circuitry 802.1 through 802.k as described above in FIG. 8.

At operation 912, the exemplary operation flow 900 selectively provides the one or more operational voltage signals from operation 910 to the memory device in accordance with the one or more second switching control signals from operation 910. The one or more first switches from operation 910, when activated, selectively provide their operational voltage signals from among the one or more operational voltage signals from operation 902 as the operating voltage $V_{DDOPERATING}$. The one or more second switches from operation 910, when deactivated, are selectively prohibited from providing their operational voltage signals from among the one or more operational voltage signals from operation 902. In an exemplary embodiment, the operation 912 can be performed by the switches 402.1 through 402.n as described above in FIG. 4, the switches 502.1 and 502.2 as described above in FIG. 5, the PMOS transistors P7.1 through P7.k as described above in FIG. 7A and FIG. 7B, the switches 804.1 and 804.2 as described above in FIG. 8 to provide some examples. In an exemplary embodiment, the one or more first switches from operation 910, when activated, selectively provide a greater one of the one or more operational voltage signals from operation 902 to the memory device to maximize the read/write speed of the memory device. In another exemplary embodiment, the one or more first switches from operation 910, when activated, selectively provide a lesser one of the one or more operational voltage signals from operation 902 to the memory device to minimize the power consumption of the memory device. The one or more second switches from operation 910, when deactivated, are selectively prohibited from providing their operational voltage signals from among the one or more operational voltage signals from operation 902 to the memory device.

CONCLUSION

The foregoing Detailed Description discloses a memory storage system. The memory storage system includes biasing circuitry, selection circuitry, and a memory device. The biasing circuitry selectively provides a maximum operating voltage signal from among multiple operational voltage signals. The selection circuitry selectively provides an operating voltage signal from among the multiple operational voltage signals. The selection circuitry includes selection control processing circuitry to provide switching control signals, where at least one switching control signal is at a logical level corresponding to the maximum operating voltage signal, and switches to selectively provide the operating voltage signal in accordance with the switching control signals. The memory device configured receive the operating voltage signal.

The foregoing Detailed Description also discloses selection circuitry for selectively providing an operating voltage signal from multiple operational voltage signals. The selection circuitry includes selection control processing circuitry and switches. The selection control processing circuitry provides a switching control signals in accordance with a biasing control signal, wherein the switching control signals is referenced to a first domain corresponding to a first operational voltage signal from among the multiple operational voltage signals, and wherein the biasing control signal is referenced to a second domain corresponding to a second operational voltage signal from among the multiple operational voltage signals, the second operational voltage signal being less than the first operational voltage signal. The switches selectively provide the operating voltage signal from among the multiple in accordance with the switching control signals.

The foregoing Detailed Description further discloses a method for operating a memory storage device. The method includes receiving a first control signal indicative of a maximum operational voltage signal from among operational voltage signals and a second control signal indicative of an operational voltage signal from among the operational voltage signals, providing the maximum operational voltage signal from among the operational voltage signals in accordance with the first control signal, shifting the second control signal from a first domain corresponding to an operational voltage signal less than the maximum operation voltage signal from among the operational voltage signals to a second domain corresponding to the maximum operational voltage signal to provide switching control signals in accordance with the second control signal, activating a first switch from among multiple switches to selectively provide a first operational voltage signal from among the operational voltage signals based on a first switching control signal from among the switching control signals, deactivating a second switch from among the multiple switches to selectively prohibit the second switch from providing a second operational voltage signal from among the operational voltage signals based on a second switching control signal from among the switching control signals, and receiving the first operational voltage signal.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A memory storage system, comprising:
    biasing circuitry configured to selectively provide a first supply voltage signal from among a plurality of supply voltage signals;
    selection circuitry configured to selectively provide a second supply voltage signal from among the plurality of supply voltage signals, the selection circuitry comprising:
        a plurality of switches configured to selectively provide the second supply voltage signal from among the plurality of supply voltage signals in accordance with a selection control signal, the selection control signal being shifted from a first voltage domain to a second voltage domain corresponding to the first supply voltage signal; and
    a memory device configured to receive the second supply voltage signal.

2. The memory storage system of claim 1, wherein the first supply voltage signal comprises a maximum supply voltage signal from among the plurality of supply voltage signals.

3. The memory storage system of claim 1, wherein the biasing circuitry comprises:
    biasing control processing circuitry configured to provide a plurality of switching control signals in response to a biasing control signal, the biasing control signal including one or more control bits indicating the first supply voltage signal from among the plurality of supply voltage signals; and
    a second plurality of switches configured to be selectively activated or deactivated in accordance with the plurality of switching control signals to selectively provide the first supply voltage signal.

4. The memory storage system of claim 1, wherein the selection circuitry further comprises:
    selection control processing circuitry configured to provide a plurality of switching control signals in accordance with the selection control signal to configure the plurality of switches to selectively provide the second supply voltage signal.

5. The memory storage system of claim 4, wherein the selection control processing circuitry is further configured to shift a voltage level of the selection control signal from the first voltage domain to the second voltage domain to provide at least one of the plurality of switching control signals in the second voltage domain.

6. The memory storage system of claim 1, wherein the selection circuitry is configured to selectively provide a maximum supply voltage signal from among the plurality of supply voltage signals as the second supply voltage signal to maximize a read/write speed of the memory device.

7. The memory storage system of claim 1, wherein the selection circuitry is configured to selectively provide a minimum supply voltage signal from among the plurality of supply voltage signals as the second supply voltage signal to minimize a power consumption of the memory device.

8. A method for operating a memory storage device, the method comprising:
    selectively providing, by the memory storage device, a first supply voltage signal from among a plurality of supply voltage signals;
    generating, by the memory storage device, a plurality of switching control signals to selectively activate or deactivate a plurality of switches of the memory storage device based upon a selection control signal, wherein the generating comprises:
shifting the selection control signal from a first voltage domain to a second voltage domain corresponding to the first supply voltage signal to provide at least one of the plurality of switching control signals in the second voltage domain; and
selectively activating or deactivating, by the memory storage device, the plurality of switches in response to the plurality of switching control signals to provide a second supply voltage signal from among the plurality of supply voltage signals to a memory device of the memory storage device.

9. The method of claim 8, wherein the first supply voltage signal comprises a maximum supply voltage signal from among the plurality of supply voltage signals.

10. The method of claim 8, wherein the selectively providing comprises:
selectively providing a second plurality of switching control signals in response to a biasing control signal, the biasing control signal including one or more control bits indicating the first supply voltage signal from among the plurality of supply voltage signals; and
selectively activating or deactivating a second plurality of switches in accordance with the second plurality of switching control signals to selectively provide the first supply voltage signal.

11. The method of claim 8, wherein the shifting comprises:
shifting a voltage level of the selection control signal from the first voltage domain to the second voltage domain.

12. The method of claim 8, wherein the selectively activating or deactivating comprises:
selectively activating or deactivating the plurality of switches to provide a maximum supply voltage signal from among the plurality of supply voltage signals as the second supply voltage signal to maximize a read/write speed of the memory device.

13. The method of claim 8, wherein the selectively activating or deactivating comprises:
selectively activating or deactivating the plurality of switches to provide a minimum supply voltage signal from among the plurality of supply voltage signals as the second supply voltage signal to minimize a power consumption of the memory device.

14. A memory storage system, comprising:
a first plurality of switches configured to selectively provide a first supply voltage signal from among a plurality of supply voltage signals;
a second plurality of switches configured to selectively provide a second supply voltage signal from among the plurality of supply voltage signals in accordance with a selection control signal, the selection control signal being shifted from a first voltage domain to a second voltage domain corresponding to the first supply voltage signal; and
a memory device configured to receive the second supply voltage signal.

15. The memory storage system of claim 14, wherein the first supply voltage signal comprises a maximum supply voltage signal from among the plurality of supply voltage signals.

16. The memory storage system of claim 14, further comprising:
biasing control processing circuitry configured to provide a plurality of switching control signals in response to a biasing control signal, the biasing control signal including one or more control bits indicating the first supply voltage signal from among the plurality of supply voltage signals,
wherein the first plurality of switches is configured to be selectively activated or deactivated in accordance with the plurality of switching control signals to selectively provide the first supply voltage signal.

17. The memory storage system of claim 14, further comprising:
selection control processing circuitry configured to provide a plurality of switching control signals in accordance with the selection control signal to configure the plurality of switches to selectively provide the second supply voltage signal.

18. The memory storage system of claim 17, further comprising:
level shifting circuitry configured to shift a voltage level of the selection control signal from the first voltage domain to the second voltage domain to provide at least one of the plurality of switching control signals in the second voltage domain.

19. The memory storage system of claim 14, wherein the second plurality of switches is configured to selectively provide a maximum supply voltage signal from among the plurality of supply voltage signals as the second supply voltage signal to maximize a read/write speed of the memory device.

20. The memory storage system of claim 14, wherein the second plurality of switches is configured to selectively provide a minimum supply voltage signal from among the plurality of supply voltage signals as the second supply voltage signal to minimize a power consumption of the memory device.

* * * * *